(12) United States Patent
Fang

(10) Patent No.: US 6,835,233 B2
(45) Date of Patent: Dec. 28, 2004

(54) METHOD AND APPARATUS FOR REDUCING PARTICLE CONTAMINATION

(75) Inventor: Buh-Kuan Fang, Taipei (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 4 days.

(21) Appl. No.: 10/371,457

(22) Filed: Feb. 20, 2003

(65) Prior Publication Data

US 2004/0163539 A1 Aug. 26, 2004

(51) Int. Cl.⁷ .............................................. B01D 46/00
(52) U.S. Cl. ...................... 95/273; 55/312; 55/385.6; 55/481
(58) Field of Search ............. 95/273, 284; 55/309–314, 55/385.1, 481, 385.6

(56) References Cited

U.S. PATENT DOCUMENTS

| | | | | |
|---|---|---|---|---|
| 3,267,648 A | * | 8/1966 | Allcorn, Jr. ................... | 96/365 |
| 3,353,551 A | * | 11/1967 | Smale ......................... | 137/114 |
| 4,002,442 A | * | 1/1977 | Merz ........................... | 55/309 |
| 4,435,194 A | * | 3/1984 | Picard et al. .................. | 95/19 |
| 4,671,810 A | * | 6/1987 | Dietzsch et al. ............... | 96/125 |
| 4,906,257 A | * | 3/1990 | Fukunaga et al. .............. | 95/19 |
| 5,053,064 A | * | 10/1991 | Hama et al. ................... | 96/111 |
| 5,647,880 A | * | 7/1997 | Johnson ........................ | 55/310 |
| 5,865,879 A | * | 2/1999 | Lee .............................. | 95/273 |
| 5,931,979 A | * | 8/1999 | Immel ......................... | 55/385.6 |
| 6,036,751 A | * | 3/2000 | Ribardi et al. ................. | 95/273 |
| 6,171,368 B1 | * | 1/2001 | Maget et al. ................... | 95/54 |
| 6,284,020 B1 | * | 9/2001 | Mizuno et al. ................. | 95/26 |
| 6,364,922 B1 | * | 4/2002 | Tanaka et al. .............. | 55/385.1 |
| 6,375,719 B1 | * | 4/2002 | Hustvedt et al. ............... | 95/273 |
| 6,395,068 B1 | * | 5/2002 | Rooney ......................... | 95/90 |
| 2002/0194995 A1 | * | 12/2002 | Shiramizu ..................... | 95/273 |
| 2003/0097935 A1 | * | 5/2003 | Burkhart ....................... | 95/273 |

* cited by examiner

*Primary Examiner*—Robert H. Spitzer
(74) *Attorney, Agent, or Firm*—Tung & Associates

(57) ABSTRACT

A method and device for gradually equalizing air or gas pressures between substrate processing chambers prior to transfer of a substrate between the chambers. The device comprises a gas flow restrictor provided in the chamber wall that separates the chambers. A door typically reversibly seals the gas flow restrictor. During substrate processing in one of the chambers, the gas flow restrictor is sealed to maintain a partial vacuum pressure in the chamber. Prior to opening the wafer transfer gate between the chambers, the gas flow restrictor door is opened to facilitate the gradual flow of air or gas from the higher-pressure chamber, through the gas flow restrictor to the lower-pressure chamber and substantially equalize the pressures in the respective chambers.

20 Claims, 2 Drawing Sheets

METHOD AND APPARATUS FOR REDUCING PARTICLE CONTAMINATION

FIELD OF THE INVENTION

The present invention generally relates to fabrication of semiconductor integrated circuits on semiconductor wafer substrates and more particularly, to an apparatus and method for eliminating or reducing particle flux and contamination caused by flow of air between processing chambers of disparate pressures during semiconductor wafer processing.

BACKGROUND OF THE INVENTION

Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer. Each of these steps provides abundant opportunity for organic, metal and other potential circuit-contaminating particles to accumulate on the wafer surface as well as on the interior surfaces of the process chambers in which the processes are carried out.

As an example, CVD processes include thermal deposition processes, in which a gas is reacted with the heated surface of a semiconductor wafer substrate, as well as plasma-enhanced CVD processes, in which a gas is subjected to electromagnetic energy in order to transform the gas into a more reactive plasma. Forming a plasma can lower the temperature required to deposit a layer on the wafer substrate, to increase the rate of layer deposition, or both. However, in plasma process chambers used to carry out these various CVD processes, materials such as polymers are coated onto the chamber walls and other interior chamber components and surfaces during the processes. These polymer coatings frequently generate particles which inadvertently become dislodged from the surfaces and contaminate the wafers.

In semiconductor production, the quality of the integrated circuits on the semiconductor wafer is directly correlated with the purity of the fabricating processes, which in turn depends upon the cleanliness of the manufacturing environment. Furthermore, technological advances in recent years in the increasing miniaturization of semiconductor circuits necessitate correspondingly stringent control of impurities and contaminants in the plasma process chamber. When the circuits on a wafer are submicron in size, the smallest quantity of contaminants can significantly reduce the yield of the wafers. For instance, the presence of particles during deposition or etching of thin films can cause voids, dislocations, or short-circuits which adversely affect performance and reliability of the devices constructed with the circuits.

Particle and film contamination has been significantly reduced in the semiconductor industry by improving the quality of clean rooms, by using automated equipment designed to handle semiconductor substrates, and by improving techniques used to clean the substrate surfaces. However, as deposit of material on the interior surfaces of the processing chamber remains a problem, various techniques for in-situ cleaning of process chambers have been developed in recent years. Cleaning gases such as nitrogen trifluoride, chlorine trifluoride, hexafluoroethane, sulfur hexafluoride and carbon tetrafluoride and mixtures thereof have been used in various cleaning applications. These gases are introduced into a process chamber at a predetermined temperature and pressure for a desirable length of time to clean the surfaces inside a process chamber. However, these cleaning techniques are not always effective in cleaning or dislodging all the film and particle contaminants coated on the chamber walls. The smallest quantity of contaminants remaining in the chamber after such cleaning processes can cause significant problems in subsequent manufacturing cycles.

FIG. 1 illustrates a typical conventional integrated cluster tool 10 for the local multi-step processing of wafers 30 in the fabrication of integrated circuits on the wafers 30. The tool 10 includes a pair of loadlock chambers 12 each of which receives a wafer cassette 32 loaded with wafers 30. A wafer transfer robot 22, provided inside a central transfer chamber 20, individually unloads each wafer 30 from one of the loadlock chambers 12 and transfers the wafer 30 first to a wafer orientation chamber 14 and then sequentially to multiple processing chambers 16. In the processing chambers 16, a variety of semiconductor fabrication processes, including chemical vapor deposition, physical vapor deposition, ion sputtering and etching, for example, are carried out on each wafer 30. The processes carried out in the processing chambers 16 are conducted under various pressures, depending upon the particular process parameters required for each process. Accordingly, a vacuum system (not shown) maintains the process chambers 16 typically at a lower pressure than the pressure that is maintained in the wafer transfer chamber 20. These pressures are typically on the order of about 4–80 mTorr. After processing of each wafer 30 in the process chambers 16 is completed, the wafer transfer robot 22 places each wafer 30 in a cool down chamber 18, and then, returns the wafer 30 to the cassette 32 in the other cool down chamber 12. Finally, the cassette 32 is transported to another processing station (not shown) in the facility for further processing of the wafers 30 therein.

During sequential transfer of each wafer 30 from one processing chamber 16 to the next processing chamber 16 in the processing sequence, the wafer transfer robot 22 removes the wafer 30 from one processing chamber 16, re-positions the wafer 30 in the transfer chamber 20 and then places the wafer 30 in the adjacent processing chamber 16, respectively. As shown in FIG. 2, a wafer transfer gate opening 26, which is reversibly closed by a gate door 28, is provided in the chamber wall 24 that divides the transfer chamber interior 21 from the process chamber interior 17 of each process chamber 16. During processing of each wafer 30 in the process chamber interior 17, the gate door 28 is closed, as shown in phantom, to sustain partial vacuum pressures inside the process chamber interior 17 while typically maintaining a higher pressure in the transfer chamber interior 21. Before transfer of the wafer 30 from one processing chamber 16 to the next processing chamber 16, the gate door 28 is opened to expose the wafer transfer gate opening 26 so that the wafer transfer robot 22 can transfer the wafer 30 from the process chamber interior 17 and back into the transfer chamber interior 21, prior to transfer of the wafer 30 into the next processing chamber 16 in the processing sequence.

As heretofore noted, during processing of the wafers 30 in each of the process chambers 16, various polymer and other impurities have a tendency to accumulate on the chamber walls in the process chamber interior 17. Upon opening of the gate door 28, the higher-pressure air inside the transfer chamber interior 21 has a tendency to rush into the lower-pressure process chamber interior 17. The flowing air dislodges particulate impurities from the chamber walls in the process chamber 16, and these have a tendency to fall on the wafer 30, potentially contaminating the devices being fabricated on the wafer 30. Accordingly, a device is needed for slowly equalizing air pressures between chambers of disparate air pressures prior to opening a wafer transfer gate door between the chambers, in order to prevent the rush or flow of air from the higher-pressure chamber to the lower-pressure chamber that would tend to dislodge potential device-contaminating particles from the walls of the lower-pressure chamber.

An object of the present invention is to provide a method and device for gradually equalizing air or gas pressures between two chambers.

Another object of the present invention is to provide a device which is suitable for substantially equalizing air or gas pressures between two chambers prior to transfer of a substrate from one of the chambers to the other chamber.

Another object of the present invention is to provide a device which substantially reduces particle contamination of substrates.

Yet another object of the present invention is to provide a method of reducing particle contamination of a substrate prior to or during transfer of the substrate between the chambers.

Still another object of the present invention is to provide a device which is suitable for providing a gradual flow of air or gas from a higher-pressure process chamber to a lower-pressure process chamber prior to transfer of a substrate between the chambers.

Yet another object of the present invention is to provide a method for gradually equalizing pressures between chambers of disparate interior air or gas pressures in order to prevent or reduce gas flow-induced particle contamination of a substrate upon transfer of the substrate between the chambers.

A still further object of the present invention is to provide a device which utilizes a filter or molecular sieve which facilitates the gradual passage of air or gas from one chamber to another chamber prior to opening a transfer gate between the chambers and transferring a substrate from one chamber to the other chamber.

SUMMARY OF THE INVENTION

In accordance with these and other objects and advantages, the present invention is generally directed to a method and device for gradually equalizing air or gas pressures between substrate processing chambers prior to transfer of a substrate between the chambers. The device comprises a gas flow restrictor provided in the chamber wall that separates the chambers. A door typically reversibly seals the gas flow restrictor. During substrate processing in one of the chambers, the gas flow restrictor is sealed to maintain a partial vacuum pressure in the chamber. Prior to opening the wafer transfer gate between the chambers, the gas flow restrictor door is opened to facilitate the gradual flow of air or gas from the higher-pressure chamber, through the gas flow restrictor to the lower-pressure chamber and substantially equalize the pressures in the respective chambers, such that a sudden rush or flow of air or gas between the chambers upon opening of the wafer transfer gate, is prevented.

BRIEF DESCRIPTION OF THE DRAWINGS

The invention will now be described, by way of example, with reference to the accompanying drawings, in which:

FIG. 2 is a side view, partially in section and with the side chamber wall removed, of a pair of adjacent chambers in the integrated cluster tool of FIG. 1, illustrating a wafer transfer gate opening or slot between the chambers for transfer of a substrate there between;

DESCRIPTION OF THE PREFERRED EMBODIMENTS

The present invention has particularly beneficial utility in the gradual equalization of air or gas pressures between chambers in which processes are carried out for the fabrication of semiconductor integrated circuits on wafer substrates. However, the invention is not so limited in application, and while references may be made to such semiconductor integrated circuits and wafer substrates, the present invention is more generally applicable to the gradual equalization of interior air or gas pressures between chambers in a variety of industrial and mechanical applications.

When used herein, the term, "gas flow restrictor" shall be construed to mean any filter, sieve, diffusor, opening, group of openings or any other device or group of devices which may be provided in a gas flow barrier between a first enclosure and a second enclosure and which is capable of restricting the rate of flow of a gas between the enclosures.

Figure 1:
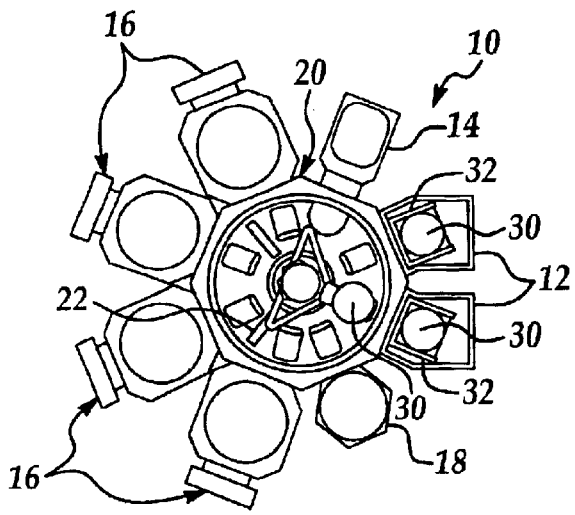
FIG. 1 is a top view of a typical conventional integrated cluster tool.
Figure 2:
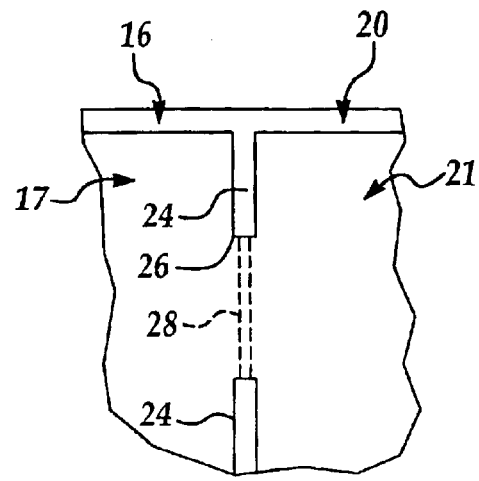
Figure 3:
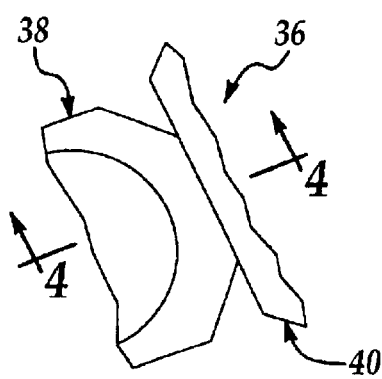
FIG. 3 is a top view, partially in section, of a pair of adjacent chambers in an integrated circuit cluster tool, in implementation of the present invention.
Figure 4:
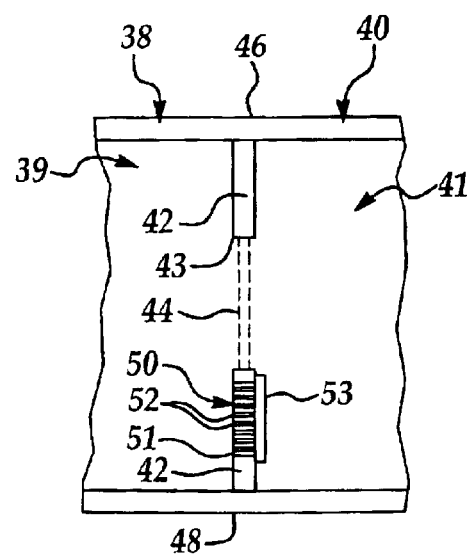
FIG. 4 is a cross-sectional view, taken along section lines 4—4 in FIG. 3.

Referring initially to FIGS. 3 and 4, the present invention is suitably adapted for use in an integrated cluster tool 36, a portion of which is shown in top view in FIG. 3. The integrated cluster tool 36 includes a central wafer transfer chamber 40 connected to multiple process chambers 38 that are clustered around the wafer transfer chamber 40, one of which process chambers 38 is partially shown in FIG. 3. However, the invention is not limited to use in an integrated cluster tool 36 and is equally adaptable to alternative systems, as well as between various other types of chambers, such as between two process chambers rather than between a wafer transfer chamber and a process chamber. As shown in FIG. 4, the process chamber 38 and the transfer chamber 40 may have a top chamber wall 46 and a bottom chamber wall 48. A dividing wall 42 divides the process chamber interior 39 from the transfer chamber interior 41. A wafer transfer gate slot 43, reversibly closed by a gate door 44, is provided in the dividing wall 42, typically in conventional fashion. At one point during multi-step processing of a wafer 56 (FIG. 7C), a wafer transfer robot (not shown) contained in the transfer chamber interior 41 typically transfers the wafer 56 (FIG. 7C) between the transfer chamber interior 41 and the process chamber interior 39, as hereinafter further described.

Figure 5:
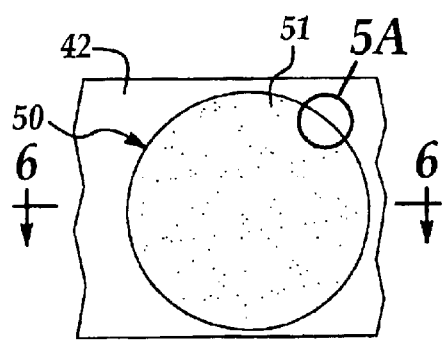
FIG. 5 is a front view of a gas flow restrictor between adjacent chambers in implementation of the present invention.
Figure 5A:
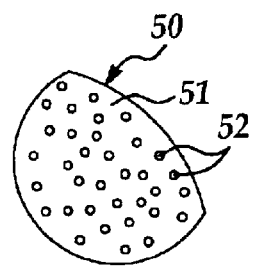
FIG. 5A is an enlarged sectional view, taken along section line 5A in FIG. 5.
Figure 6:
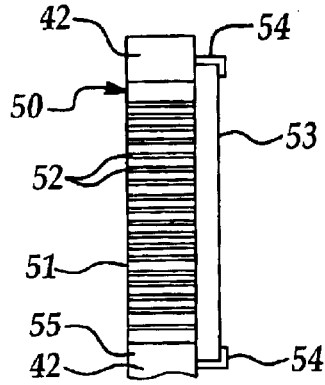
FIG. 6 is a sectional view, taken along section lines 6—6 in FIG. 5, of the gas flow restrictor of the present invention.

Referring next to FIGS. 3–6 and 9, in accordance with the present invention, a typically circular gas flow restrictor 50 is provided in a correspondingly sized and shaped restrictor opening 55 in the chamber dividing wall 42, as shown in FIG. 6, for selectively and reversibly establishing gas communication between the process chamber interior 39 and the transfer chamber interior 41. The restrictor opening 55 typically has a diameter of about 2 inches; however, the restrictor opening 55 may have a larger or smaller diameter, as desired. The gas flow restrictor 50 may be a diffusor, air filter, molecular sieve or any type of structure which facilitates the passage of a gas therethrough while retarding or impeding flow of the gas. The gas flow restrictor 50 may include a typically metal or plastic restrictor panel 51, having multiple gas flow channels or openings 52 extending therethrough and traversing the thickness of the restrictor panel 51. As shown in FIG. 5A, the gas flow openings 52 may be more or less randomly distributed in the restrictor panel 51, or arranged in any selected pattern in the restrictor panel 51. A restrictor door 53 is provided typically in the transfer chamber interior 41, against the dividing wall 42, for selectively blocking flow of gas between the process chamber interior 39 and the transfer chamber interior 41. As shown in FIG. 6, a pair of door brackets 54 may be mounted on the dividing wall 42 inside the transfer chamber interior 41, on opposite sides of the gas flow restrictor 50, such that the restrictor door 53 is slidably disposed between the door brackets 54. A sealing member (not shown), such as a resilient rubber or plastic gasket, may be interposed between each door bracket 54 and the restrictor door 53 to provide a gas-tight seal between the door brackets 54 and the restrictor door 53. It is understood that the restrictor door 53 and associated components may be alternatively provided against the dividing wall 42, in the process chamber interior 39 rather than in the transfer chamber interior 41, as desired.

Figure 9:
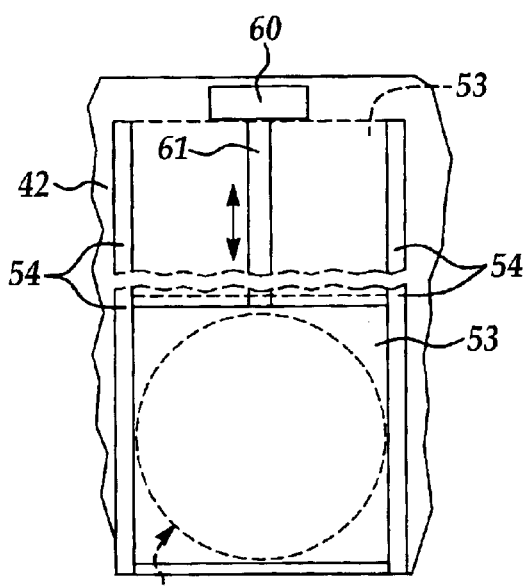
FIG. 9 is a front view of the sealing door component for the gas flow restrictor of the present invention, illustrating an illustrative technique for opening and closing the sealing door for reversibly sealing and opening the gas flow restrictor.

As shown in FIG. 9, a door lift motor 60, which engages a door lift arm 61, is provided on the dividing wall 42, typically above the restrictor door 53. The door lift arm 61 engages the restrictor door 53. Normally, the restrictor door 53 is disposed in the lower position indicated by the solid lines of the restrictor door 53 in FIG. 9, such that the restrictor door 53 blocks the gas flow restrictor 50 and thereby prevents passage of gas between the process chamber interior 39 and the transfer chamber interior 41 through the gas flow openings 52. By actuation of the door lift motor 60, the restrictor door 53 is slidably displaced on the door brackets 54 and uncovers the gas flow restrictor 50, as indicated by the phantom lines of the restrictor door 53 shown in FIG. 9, thereby enabling passage of gas between the process chamber interior 39 and the transfer chamber interior 41 through the multiple exposed gas flow openings 52 of the gas flow restrictor 50, as hereinafter described. By reverse actuation of the door lift motor 60, the door lift arm 61 displaces the restrictor door 53 on the door brackets 54 until the restrictor door 53 again blocks the gas flow restrictor 50, as indicated by the solid lines of the restrictor door 53 in FIG. 9. It is understood that the door lift motor 60 may be located in any suitable location which facilitates reversibly displacing the restrictor door 53 from the sealing position adjacent to the gas flow restrictor 50, and need not necessarily be located above the restrictor door 53 as heretofore described with respect to FIG. 9. It is further understood that various alternative mechanisms known by those skilled in the art, other than the door lift motor 60 and the door lift arm 61, may be utilized to displace the restrictor door 53 between the open and closed positions with respect to the gas flow restrictor 50.

Figure 7A:
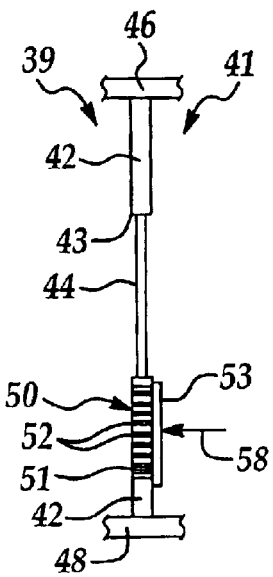
FIG. 7A is a cross-sectional view, taken along section lines 4—4 in FIG. 3, illustrating a gate door blocking the wafer transfer gate opening between the chambers.

Referring next to FIGS. 7A–9, the gas flow restrictor 50 of the present invention is capable of gradually equalizing gas pressures between two chambers of disparate gas pressures, such as between a wafer transfer chamber 40 and a process chamber 38, prior to transfer of a wafer 56 between the chambers. For example, the wafer 56 may be initially contained in the process chamber 38, which may be an etching chamber. Accordingly, an etching process is carried out on the wafer 56 in the process chamber 38 to facilitate etching of a circuit pattern in a conductive layer on the wafer 56, for example. In such a process, the process chamber interior 39 is maintained at a pressure of typically about 4–80 mTorr, whereas the transfer chamber interior 41 is maintained at a somewhat higher pressure of about 100 mTorr to about 200 mTorr. Accordingly, as shown in FIG. 7A, during the etching process the gate door 44 is in the closed position to seal the wafer transfer gate slot 43, and the restrictor door 53 is in the closed position to seal the gas flow openings 52 of the gas flow restrictor 50. Consequently, gas 58 in the higher-pressure transfer chamber interior 41 impinges against the dividing wall 42 and the closed gate door 44, as well as against the restrictor door 53 of the gas flow restrictor 50, and is incapable of flowing from the transfer chamber interior 41 and into the process chamber interior 39. As a result, the transfer chamber interior 41 is maintained at a gas pressure which is higher than that of the process chamber interior 39 throughout the etching or other process carried out in the process chamber interior 39.

Figure 7B:
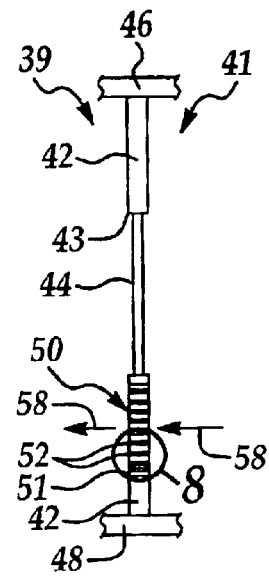
FIG. 7B is a cross-sectional view, taken along section lines 4—4 in FIG. 3, illustrating opening of the gas flow restrictor between the chambers in implementation of the present invention to equalize air or gas pressure between the chambers.
Figure 7C:
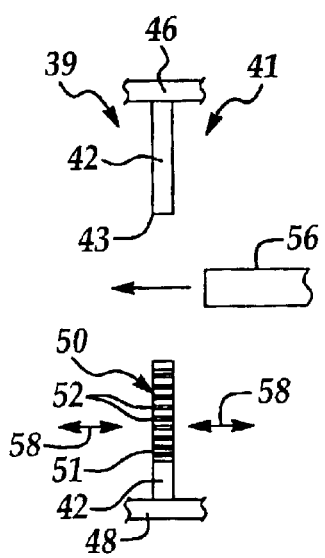
FIG. 7C is a cross-sectional view, taken along section lines 4—4 in FIG. 3, illustrating opening of the gate door between the chambers and transfer of a wafer through the gate opening in implementation of the present invention, after pressure equalization between the chambers.
Figure 8:
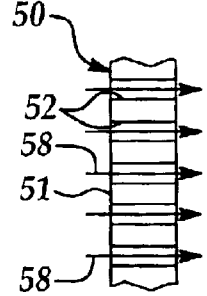
FIG. 8 is an enlarged sectional view, taken along section line 8 in FIG. 7B.

After the etching or other process carried out in the process chamber interior 39 is completed, the gate door 44 initially remains closed while the restrictor door 53 is opened to expose the gas flow openings 52 of the gas flow restrictor 50, as shown in FIG. 7B. Opening of the restrictor door 53 is typically facilitated by operation of the door lift motor 60, as heretofore described with respect to FIG. 9. Accordingly, the gas 58 in the higher-pressure transfer chamber interior 41 slowly flows from the transfer chamber interior 41, through the respective gas flow openings 52 of the gas flow restrictor 50 as shown in FIG. 8, and into the process chamber interior 39, respectively. Those portions of the restrictor panel 51 between the gas flow openings 52 tend to substantially retard the flow of the gas 58 from the transfer chamber interior 41 into the process chamber interior 39. The restrictor door 53 remains in the open position for typically at least about one minute to facilitate flow of the initially higher-pressure gas 58 in the transfer chamber interior 41 into the process chamber interior 39 until the pressures of the gas 58 in the transfer chamber interior 41 and in the process chamber interior 39 are substantially equal, as shown in FIG. 7C. At that point, an equilibrium of gas flow through the gas flow openings 52 in both directions is reached, as indicated by the double-headed arrows 58 in FIG. 7C. The gate door 44 is then opened to expose the wafer transfer gate slot 43, after which the wafer 56 is transferred from the transfer chamber interior 41, through the wafer transfer gate slot 43 and into the process chamber interior 39, respectively, typically by automated operation of the wafer transfer robot (not shown), in conventional fashion. It will be appreciated by those skilled in the art that since the wafer 56 is transferred through the wafer transfer gate slot 43 and into the process chamber interior 39 only after the pressures of the gas 58 are substantially equal in the respective chamber interiors 39, 41, a rush of gas from the chamber interior 41 and into the chamber interior 39 is prevented upon opening of the wafer transfer gate slot 43 and transfer of the wafer 56 therethrough. Accordingly, particulate contaminants (not shown) which have previously accumulated on the interior surfaces of the process chamber 38 are less likely to become dislodged from those surfaces and fall on the wafer 56 and contaminate devices being fabricated on the wafer 56 during the wafer-transfer procedure. After transfer of the wafer 56 into the process chamber interior 39 is completed, the gate door 44 is closed to seal the wafer transfer gate slot 43 and the restrictor door 53 is closed to seal the gas flow openings 52 in the gas flow restrictor 50, as shown in FIG. 7A. This facilitates the re-establishment of partial vacuum pressure in the process chamber interior 39 preparatory to resuming processing of the wafer in the process chamber interior 39.

While the preferred embodiments of the invention have been described above, it will be recognized and understood that various modifications can be made in the invention and the appended claims are intended to cover all such modifications which may fall within the spirit and scope of the invention.

What is claimed is:

1. A method of reducing gas flow-induced generation of particles in a first chamber connected to a second chamber via a dividing wall, comprising the steps of:

providing a gas flow restrictor in the dividing wall between the first chamber and the second chamber; and substantially equalizing gas pressures between the first chamber and the second chamber by flowing a gas between the first chamber and the second chamber, through said gas flow restrictor.

2. The method of claim 1 wherein said gas flow restrictor comprises a panel for engaging the dividing wall and a plurality of gas flow openings extending through said panel.

3. The method of claim 1 further comprising the step of providing a restrictor door against said gas flow restrictor and wherein said flowing a gas between the first chamber and the second chamber comprises the step of removing said restrictor door from said gas flow restrictor.

4. The method of claim 3 wherein said gas flow restrictor comprises a panel for engaging the dividing wall and a plurality of gas flow openings extending through said panel.

5. The method of claim 1 wherein said flowing a gas between the first chamber and the second chamber, through said gas flow restrictor comprises the step of flowing the gas between the first chamber and the second chamber, through said gas flow restrictor for at least about 1 minute.

6. The method of claim 5 wherein said gas flow restrictor comprises a panel for engaging the dividing wall and a plurality of gas flow openings provided in said panel.

7. The method of claim 5 further comprising the step of providing a restrictor door against said gas flow restrictor and wherein said flowing a gas between the first chamber and the second chamber comprises the step of removing said restrictor door from said gas flow restrictor.

8. The method of claim 7 wherein said gas flow restrictor comprises a panel for engaging the dividing wall and a plurality of gas flow openings provided in said panel.

9. A method of reducing gas flow-induced generation of particles in a first chamber connected to a second chamber via a dividing wall having a gate slot reversibly closed by a gate door, said method comprising the steps of:

providing, a gas flow restrictor in said dividing wall between the first chamber and the second chamber;

substantially equalizing gas pressures between the first chamber and the second chamber by flowing a gas between the first chamber and the second chamber, through said gas flow restrictor; and opening said gate slot by displacing said gate door from a closed position to an open position.

10. The method of claim 9 wherein said gas flow restrictor comprises a restrictor panel for engaging the dividing wall and a plurality of gas flow openings extending through said restrictor panel.

11. The method of claim 9 further comprising the step of providing a restrictor door against said gas flow restrictor and wherein said flowing a gas between the first chamber and the second chamber comprises the step of removing said restrictor door from said gas flow restrictor.

12. The method of claim 11 wherein said gas flow restrictor comprises a restrictor panel for engaging the dividing wall and a plurality of gas flow openings extending through said restrictor panel.

13. The method of claim 9 wherein said flowing a gas between the first chamber and the second chamber, through said gas flow restrictor comprises the step of flowing the gas between the first chamber and the second chamber, through said gas flow restrictor for at least about 1 minute.

14. The method of claim 13 wherein said gas flow restrictor comprises a restrictor panel for engaging the dividing wall and a plurality of gas flow openings extending through said restrictor panel.

15. The method of claim 13 further comprising the step of providing a restrictor door against said gas flow restrictor and wherein said flowing a gas between the first chamber and the second chamber comprises the step of removing said restrictor door from said gas flow restrictor.

16. The method of claim 15 wherein said gas flow restrictor comprises a restrictor panel for engaging the dividing wall and a plurality of gas flow openings extending through said restrictor panel.

17. A multi-chamber system comprising:

a first chamber for containing a first gas having a first pressure;

a second chamber for containing a second gas having a second pressure greater than said first pressure;

a gas flow restrictor confluently connecting said first chamber and said second chamber, whereby the second gas flows from said second chamber, through said gas flow restrictor into said first chamber until said first pressure substantially equals said second pressure; and a restrictor sealing mechanism selectively positional with respect to said gas flow restrictor for blocking said gas flow restrictor and providing a fluid-tight seal between said first chamber and said second chamber.

18. The multi-chamber system of claim 17 wherein said gas flow restrictor comprises a restrictor panel for engaging the dividing wall and a plurality of gas flow openings extending through said restrictor panel.

19. The multi-chamber system of claim 17 wherein said restrictor sealing mechanism comprises a restrictor door removably engaging said gas flow restrictor for reversibly blocking flow of the second gas from said second chamber, through said gas flow restrictor to said first chamber.

20. The multi-chamber system of claim 17 further comprising a gate opening between said first chamber and said second chamber for transferring a substrate between said first chamber and said second chamber.

* * * * *